United States Patent
Rutledge et al.

(10) Patent No.: US 6,930,556 B2
(45) Date of Patent: Aug. 16, 2005

(54) ACTIVE-LOOP, SPATIALLY-COMBINED AMPLIFIER

(75) Inventors: David B. Rutledge, Pasadena, CA (US); James Rosenberg, Monrovia, CA (US); Ichiro Aoki, Arcadia, CA (US); Scott D. Kee, Tustin, CA (US); Michael P. DeLisio, Jr., Monrovia, CA (US)

(73) Assignee: California Institute of Technology, Pasadena, CA (US)

( * ) Notice: Subject to any disclaimer, the term of this patent is extended or adjusted under 35 U.S.C. 154(b) by 0 days.

(21) Appl. No.: 10/397,475

(22) Filed: Mar. 26, 2003

(65) Prior Publication Data

US 2003/0184385 A1 Oct. 2, 2003

Related U.S. Application Data

(60) Provisional application No. 60/367,579, filed on Mar. 26, 2002.

(51) Int. Cl.[7] .............................................. H03F 3/60
(52) U.S. Cl. ......................... 330/286; 330/54; 330/53; 330/295
(58) Field of Search ......................... 330/286, 54, 53, 330/295; 257/795, 275; 343/702

(56) References Cited

U.S. PATENT DOCUMENTS

| | | | | |
|---|---|---|---|---|
| 3,593,174 A | * | 7/1971 | White .......................... | 330/53 |
| 3,634,888 A | * | 1/1972 | Reidy .......................... | 343/702 |
| 4,291,278 A | | 9/1981 | Quine .......................... | 330/286 |
| 5,144,257 A | * | 9/1992 | Karsten et al. ................ | 330/54 |
| 5,276,455 A | | 1/1994 | Fitzsimmons et al. ...... | 343/777 |
| 6,321,734 B1 | * | 11/2001 | Kaminaga et al. ........... | 257/795 |
| 2003/0184385 A1 | * | 10/2003 | Rutledge et al. ............. | 330/286 |

FOREIGN PATENT DOCUMENTS

GB    2242808    * 10/1991

OTHER PUBLICATIONS

Aitchiron et al. "A miniature O5–8GHz I watt hybrid distributed power amplifier for phased array applications", IEEE Colloquium on Multi–Octave Active and Passive Components and Antennas May 10, 1989 pp 6/1–6/5.*

Invitation to Pay Additional Fees for PCT/US03/09241 Dated Aug. 7, 2003 in co–pending PCT filing of U.S. application filed herewith.

Search Report for PCT/US03/09241 Dated Dec. 2, 2003 in co–pending PCT filing of U.S. application filed herewith.

* cited by examiner

*Primary Examiner*—Michael B. Shingleton
(74) *Attorney, Agent, or Firm*—Christopher J. Rourk; Godwin Gruber LLP (57) ABSTRACT

A system for amplifying a signal is provided. The system includes a wave guide and an active loop amplifier disposed in the wave guide. The active loop amplifier receives the signal and generates a magnetic field in response to the signal, such as one that couples to the propagating mode of the wave guide.

20 Claims, 7 Drawing Sheets

ACTIVE-LOOP, SPATIALLY-COMBINED AMPLIFIER

This Application claims benefit of No. 60/367,579 filed Mar. 26, 2002

FIELD OF THE INVENTION

The present invention pertains to amplifiers, and more specifically to an active-loop, spatially-combined amplifier, such as for use in a wave guide or other suitable applications.

BACKGROUND OF THE INVENTION

Amplifiers for microwave, millimeter-wave, or other high frequency applications are known in the art. Such amplifiers are used to amplify a signal for radar imaging, telecommunications, or in other applications. High power amplifiers for these application are expensive to manufacture, because of the demands placed on the materials that are used to manufacture high frequency power amplifiers. Combining the outputs from a number of individual solid state elements at a low loss and providing a means for launching a signal into a waveguide from a microstrip input feed are several of the problems encountered with such amplifiers.

In addition, high frequency amplifiers are typically used to modulate a signal onto an electric field, such as through the use of dipole antenna. Such electric fields can be spatially combined in a wave guide, into a beam propagating in free space environment using a quasi-optical array, or for other suitable applications.

SUMMARY OF THE INVENTION

In accordance with the present invention, an active-loop amplifier is provided that can be used in a wave guide or other suitable application.

In particular, an active-loop amplifier is provided that can be used to generate a spatially-combined magnetic field for use in wave guides, beams propagating in free space generated by quasi-optical arrays, or in other suitable applications.

In accordance with an exemplary embodiment of the present invention, a system for amplifying a signal is provided. The system includes a wave guide and an active loop amplifier disposed in the wave guide. The active loop amplifier receives the signal and generates a magnetic field in response to the signal, such as one that couples to the propagating mode of the wave guide.

The present invention provides many important technical advantages. One important technical advantage of the present invention is an active-loop amplifier that can be used to couple to the propagating mode of a wave guide, in a quasi-optical array, or in other suitable environments.

Those skilled in the art will further appreciate the advantages and superior features of the invention together with other important aspects thereof on reading the detailed description that follows in conjunction with the drawings.

DETAILED DESCRIPTION OF THE INVENTION

In the description that follows like parts are marked throughout the specification and drawings with the same reference numerals, respectively. The drawing figures are not necessarily to scale and certain features may be shown in somewhat generalized or schematic form in the interest of clarity and conciseness.

Figure 1:
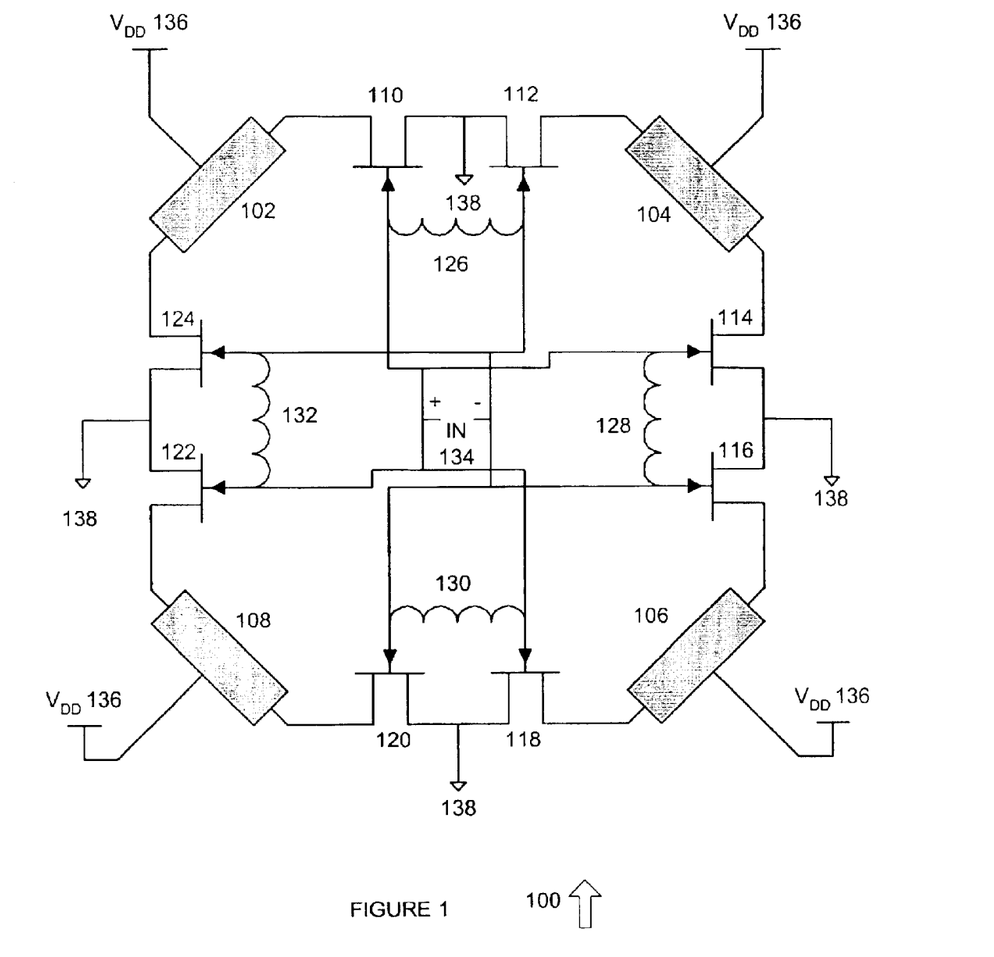
FIG. 1 is a schematic diagram of an active loop amplifier in accordance with an exemplary embodiment of the present invention.

FIG. 1 is a schematic diagram of an active loop amplifier 100 in accordance with an exemplary embodiment of the present invention. Active loop amplifier 100 can be used to amplify a signal and output a magnetic field that can couple to the propagating mode in a wave guide, can be used in a quasi-optical system or array, or which can otherwise be used to transmit the amplified signal, including high frequency signals.

Active loop amplifier 100 includes loop segments 102, 104, 106, and 108, which can be implemented as a conducting element on a semiconductor substrate, a gold conductor, or in other suitable manners. Each loop segment includes an associated transistor driver pair. For example, loop segment 102 is coupled to transistors 110 and 124, loop segment 104 is coupled to transistors 112 and 114, loop segment 106 is coupled to transistors 116 and 118, and loop segment 108 is coupled to transistors 120 and 122. Transistors 110 through 124 can be gallium arsenide pseudomorphic high electron mobility transistor (GaAs pHEMT), bipolar junction transistors (BJTs), or other suitable devices implemented in silicon, gallium arsenide, or other suitable materials. As used herein, the term "couple" can include a physical connection, such as through a gold conductor, a conducting element on a semiconductor substrate, or other suitable connections.

Each loop segment can also be coupled to a voltage source at its midpoint, shown as $V_{DD}$ 136. In this exemplary manner, each loop segment can conduct current from ground 138 through either of the associated transistor drivers to voltage source $V_{DD}$ 136. Thus, an alternating current can be generated on each loop segment by differentially driving the associated transistor drivers. For example, for loop segment 102, current can flow from ground 138 through transistor 110 through loop segment 102 to $V_{DD}$ 136, and transistor 110 and transistor 124 can then be controlled so that current flows from ground 138 through transistor 124 and loop segment 102 to $V_{DD}$ 136. In this manner, an alternating current can be induced on loop segment 102 or other loop segments. Likewise, an alternating current can be generated in each loop segment by switching $V_{DD}$ 136 and ground 138 to alternating endpoints of each loop segment, or by other suitable procedures or circuit architectures.

Active loop amplifier 100 includes matching inductors 126, 128, 130, and 132, which are coupled in parallel across signal input 134, and which can be used to provide an impedance matched load to the driver providing the signal at signal input 134. Inductors 126 through 132 can be implemented as loop conductors on a semiconducting substrate, as gold conductor loops, or in other suitable manners. In the exemplary configuration of active loop amplifier 100, the relative polarity of the signal provided at signal input 134 causes transistors 110 through 124 to alternately turn on or turn off, thus creating a balanced current distribution in each of loop segments 102 through 108.

In operation, when a signal is provided at signal input 134, each loop segment 102 through 108 conducts current through its associated transistor pair in response to the gate voltage applied at each transistor. In this manner, a signal can be amplified and used to generate a magnetic field that can couple to the propagating mode of a wave guide, that can be used in a quasi-optical array, or which can be used in other suitable applications. Active loop amplifier 100 thus creates a radiating electromagnetic field that is proportional to the signal applied at signal input 134.

Although a center tapped architecture is shown in FIG. 1, other suitable architectures can be used to modulate the input signal onto loop segments 102 through 108. In one exemplary embodiment, the transistor pairs associated with each loop segment can be replaced by switches that alternately connect the loop segment to a current source or ground, as previously described. Likewise, adjacent transistors from adjacent loop segments, such as transistors 110 and 112, can be bypassed by a switch or other suitable device, so as to affectively double the length of a loop segment that is driven by a transistor pair. For example, loop segments 102 and 104 can be combined if transistors 110 and 112 are bypassed, so as to allow the resulting loop segment to be driven by the resulting transistor pair 124 and 114. Likewise, other suitable combinations of loop segments and transistors can be used, such as configurations having two loop segments, three loop segments, five loop segments, capacitive coupling between adjacent loop segments, or other suitable configurations.

Figure 2:
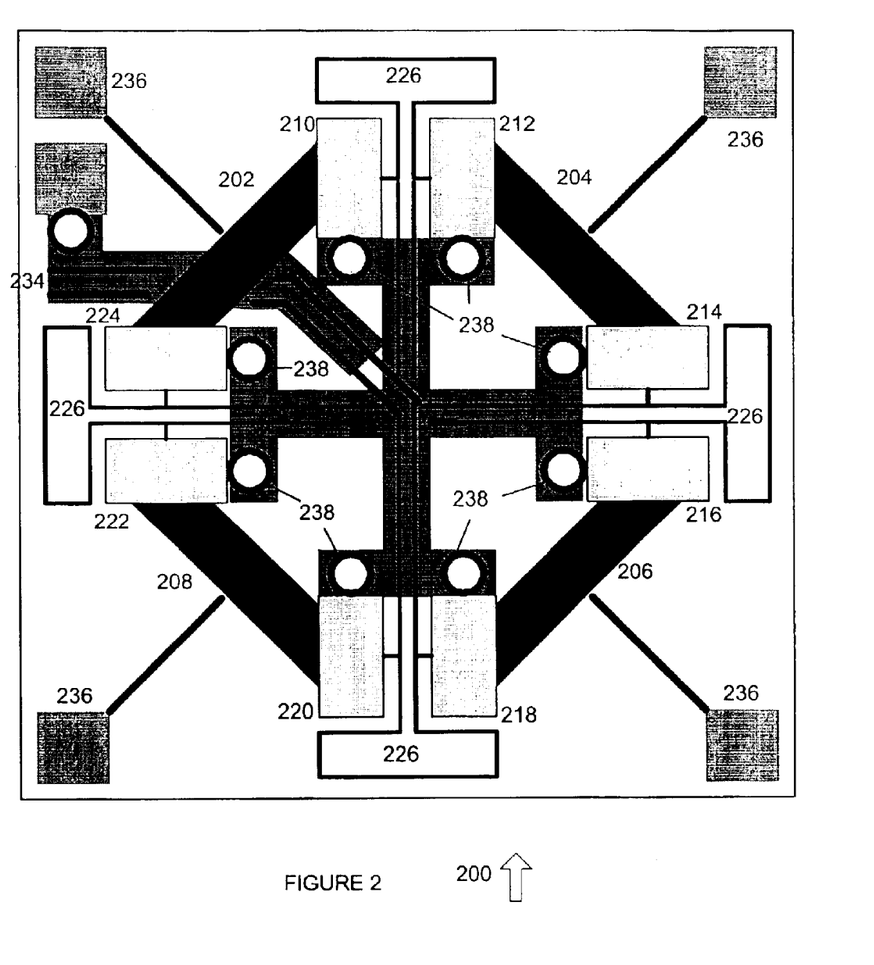
FIG. 2 is a diagram of an active loop amplifier implemented on a semiconducting substrate in accordance with an exemplary embodiment of the present invention.

FIG. 2 is a diagram of an active loop amplifier 200 implemented on a semiconducting substrate in accordance with an exemplary embodiment of the present invention. Active loop amplifier 200 includes loop segments 202, 204, 206, and 208, which are coupled to associated transistor pairs. For example, loop segment 202 is coupled to transistors 210 and 224, loop segment 204 is coupled to transistors 212 and 214, loop segment 206 is coupled to transistors 216 and 218 and loop segment 208 is coupled to transistors 220 and 222. Matching inductors 226, 228, 230, and 232 are provided and are coupled to input 234. Likewise, voltage source $V_{DD}$ 236 is coupled to the midpoint of each of loop segments 202 through 208. Active loop amplifier 200 provides an exemplary layout for implementation of an active loop amplifier on a GaAs substrate or other suitable architectures.

In operation, a signal applied to input 234 causes transistors 210 through 224 to alternately turn on and off, so as to induce an alternating current through loop segments 202 through 208. Each transistor 210 through 224 is coupled to a loop segment and to a ground via 238, such that when the transistor is turned on, current can flow from the ground via through the transistor to the loop segment, and then to $V_{DD}$ 236. The current through each of the loop segments is thus balanced, and a magnetic field is generated that is proportional to the loop current.

Figures 3, 4A, 4B:
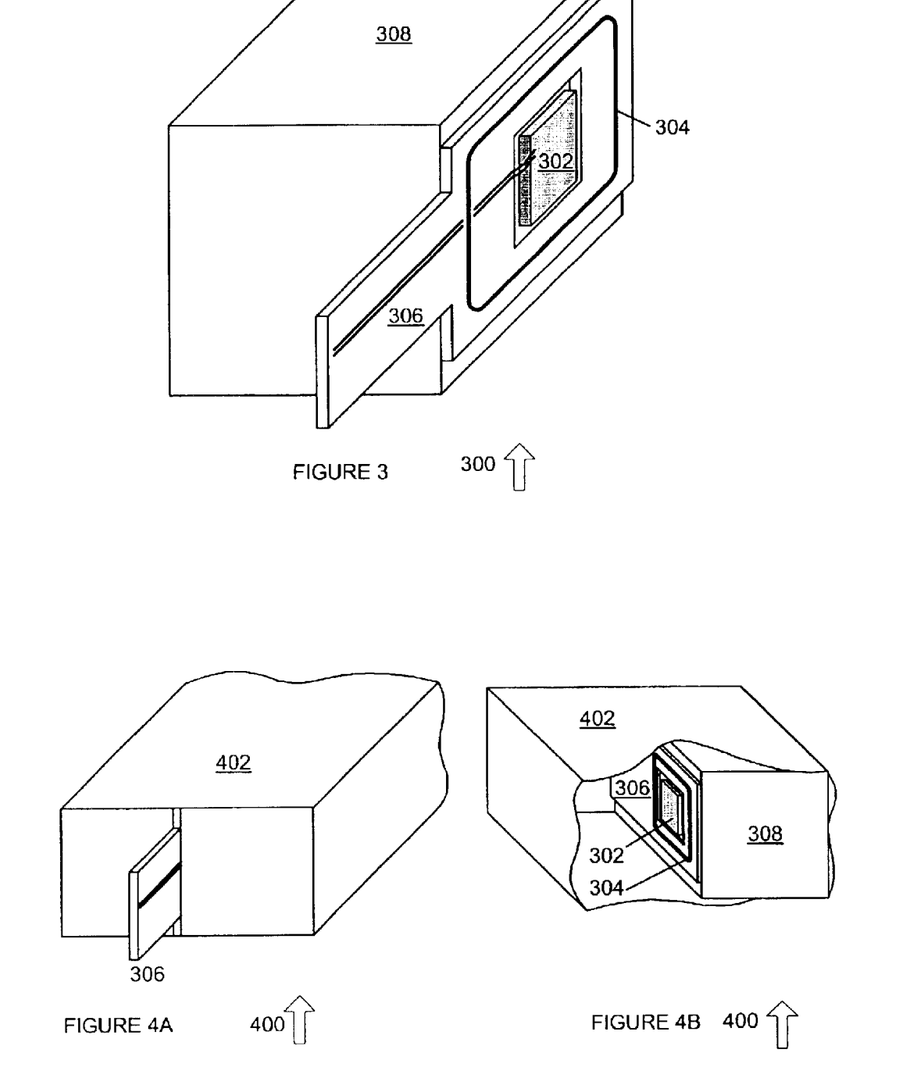
FIG. 3 is a diagram of a mounted active loop amplifier in accordance with an exemplary embodiment of the present invention.
FIGS. 4A and 4B are views of a wave guide transmission system in accordance with an exemplary embodiment of the present invention.

FIG. 3 is a diagram of a mounted active loop amplifier 300 in accordance with an exemplary embodiment of the present invention. Mounted active loop amplifier 300 includes active loop amplifier 302 mounted on a printed wiring board 306. Likewise, a parasitic element 304 can be used to provide coupling between active loop amplifier 302 and an external magnetic field, such as one created by other active loop amplifiers 302, one propagated through a wave guide, or other suitable fields. Printed wiring board 306 is attached to a ceramic heat spreader 308, which can be used to dissipate heat generated by active loop amplifier 302.

Mounted active loop amplifier 300 is configured for use and installation in a wave guide, a quasi-optical array, or other suitable configurations that can be used to transmit a high frequency electromagnetic field. The use of a ceramic heat spreader 308, parasitic element 304, and other features of mounted active loop amplifier 300 improves the mechanical stability and reliability of the associated active loop amplifier 302, and further allows the associated active loop amplifier 302 to be implemented in a wave guide, a quasi-optical array, or in other suitable configurations.

FIGS. 4A and 4B are views of a wave guide transmission system 400 in accordance with an exemplary embodiment of the present invention. In FIG. 4A, wave guide transmission system 400 is shown with printed wiring board 306 of a mounted active loop amplifier 300 extending from an access slot in wave guide 402. A microstrip transmission line or other suitable conductors can be used to provide the signal to active loop amplifier 302 for amplification.

FIG. 4B shows an alternate view of wave guide transmission system 400, in which wave guide 402 is cut away to show active loop amplifier 302 and parasitic element 304 mounted on printed wiring board 306, which is disposed on ceramic heat spreader 308. The placement of the active loop amplifier 302 in the waveguide 402 can be selected can be selected so as to propagate the electromagnetic field generated by active loop amplifier 100 through wave guide 402. In this exemplary embodiment, active loop amplifier 302 is configured to couple to the propagating mode of wave guide 402, such as by coordinating the frequency of operation of active loop amplifier 302 with the propagating mode frequency of wave guide 402.

In operation, wave guide transmission system 400 uses an active loop amplifier 302 to generate a magnetic field that is coupled to the propagating mode of wave guide 402. Ceramic heat spreader 308 provides mechanical stability for active loop amplifier 302, as well as heat dissipation.

Figure 5:
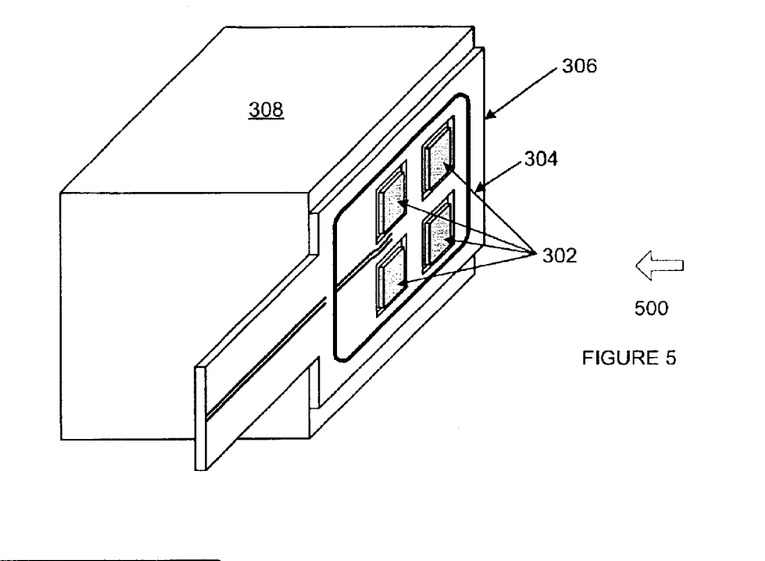
FIG. 5 is a diagram of an active loop amplifier assembly in accordance with an exemplary embodiment of the present invention.

FIG. 5 is a diagram of an active loop amplifier assembly 500 in accordance with an exemplary embodiment of the present invention. Active loop amplifier assembly 500 includes four active loop amplifiers 302 disposed on a printed wiring board 306. Parasitic element 304 encircles the active loop amplifiers 302, and the assembly is mounted on a ceramic heat spreader 308. Active loop amplifier assembly 500 allows the electromagnetic field generated by each of the active loop amplifiers 302 to be spatially combined, so as to increase the power that can be output by active loop amplifier assembly 500. Likewise, other suitable numbers of active loop amplifiers 302 can be disposed on a single active loop amplifier assembly.

Figure 6A:
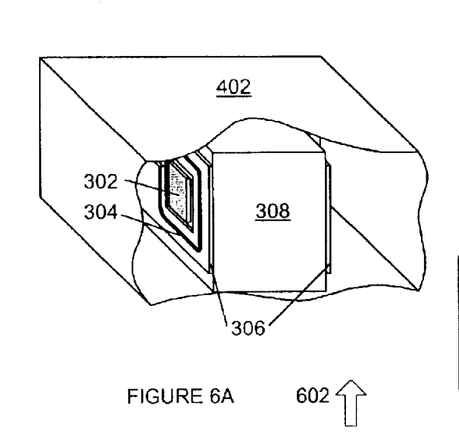
FIG. 6A AND 6B are diagrams of active loop amplifier assemblies showing alternative configurations of active loop amplifiers disposed in wave guides in accordance with exemplary embodiments of the present invention.
Figure 6B:
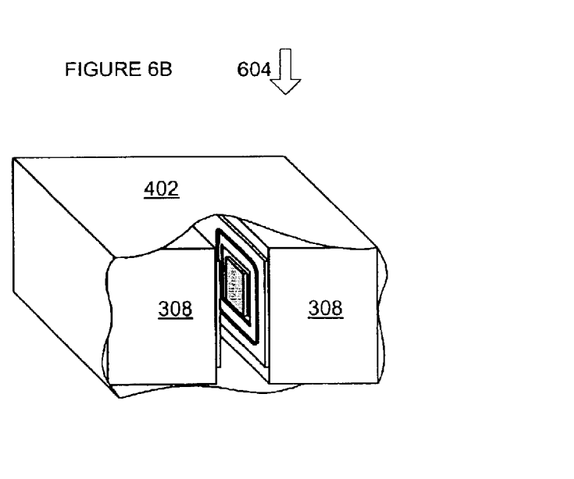

FIG. 6A AND 6B are diagrams of active loop amplifier assemblies 602 and 604 showing alternative configurations of active loop amplifiers 302 disposed in wave guides in accordance with exemplary embodiments of the present invention. In FIG. 6A, a single ceramic heat spreader 308 is used to support two printed wiring boards 306, with associated parasitic elements 304 and active loop amplifiers 302. As shown in the cut-away view of wave guide 402, ceramic heat spreader 308 is positioned so as to allow the magnetic fields generated by active loop amplifiers 302 to couple to the propagating mode of wave guide 402, and also to spatially combine the electromagnetic fields generated by each of the active loop amplifiers.

Likewise, as shown in FIG. 6B, two ceramic heat spreaders 308 can be disposed within wave guide 402, where active loop amplifiers 302 disposed on each associated ceramic heat spreader 308 are positioned so as to couple to the propagating mode of wave guide 402 as well as to spatially combine the electromagnetic fields generated by each active loop amplifier. The length of each loop segment of the active loop amplifiers 302, the configuration of the loop segments, and the operating frequency are selected so as to allow the active loop amplifiers 302 to couple to the propagating mode of wave guide 402, based upon the dimensions of wave guide 402, the location of active loop amplifiers 302 within wave guide 402, and other suitable criteria.

Likewise, other configurations of active loop amplifier arrays or assemblies can be provided inside of wave guides based upon the operating frequency of wave guide, the cooling requirements required for each active loop amplifier 302, and other suitable criteria.

Figure 7:
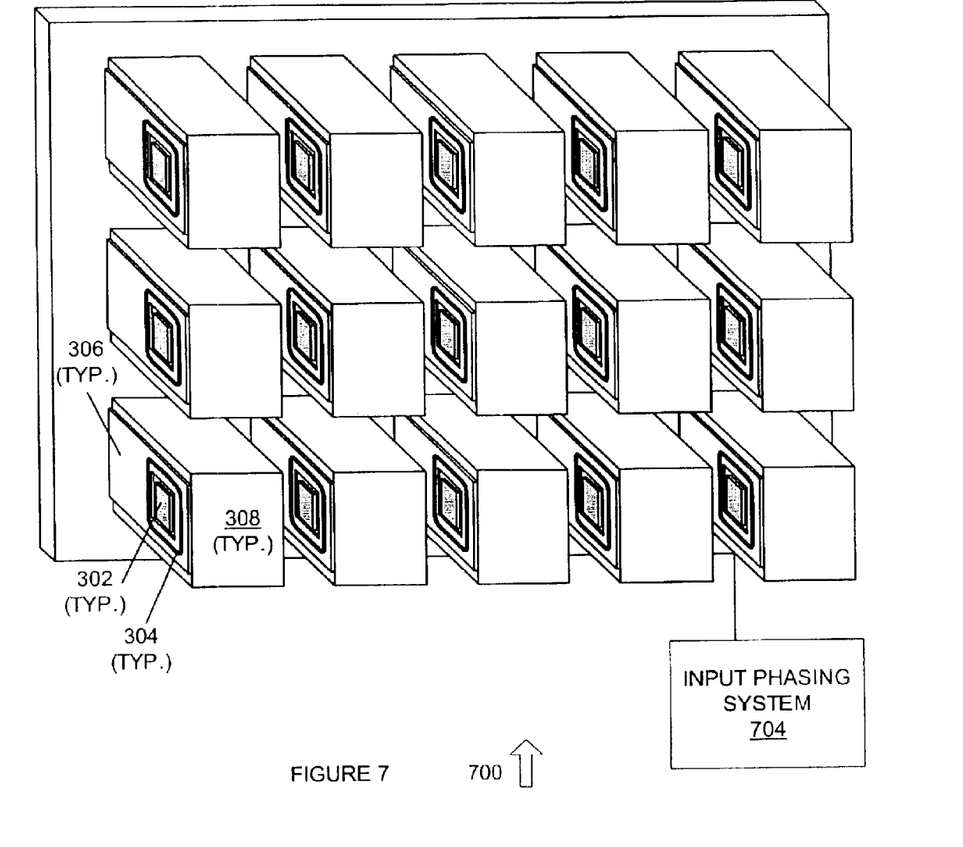
FIG. 7 is a diagram of a quasi-optical array of active loop amplifiers in accordance with an exemplary embodiment of the present invention.

FIG. 7 is a diagram of a quasi-optical array 700 of active loop amplifiers 302 in accordance with an exemplary embodiment of the present invention. Quasi-optical array 700 as shown includes a three by five array of mounted active loop amplifiers 300, including active loop amplifiers 302, parasitic elements 304, printed circuit boards 306, and ceramic heat spreaders 308. Quasi-optical array 700 can employ reflective or transmissive focusing elements for beam formation, can use input phasing system 704 to generate a steerable output of the amplified electromagnetic signal, or can use other suitable processes.

Figure 8:
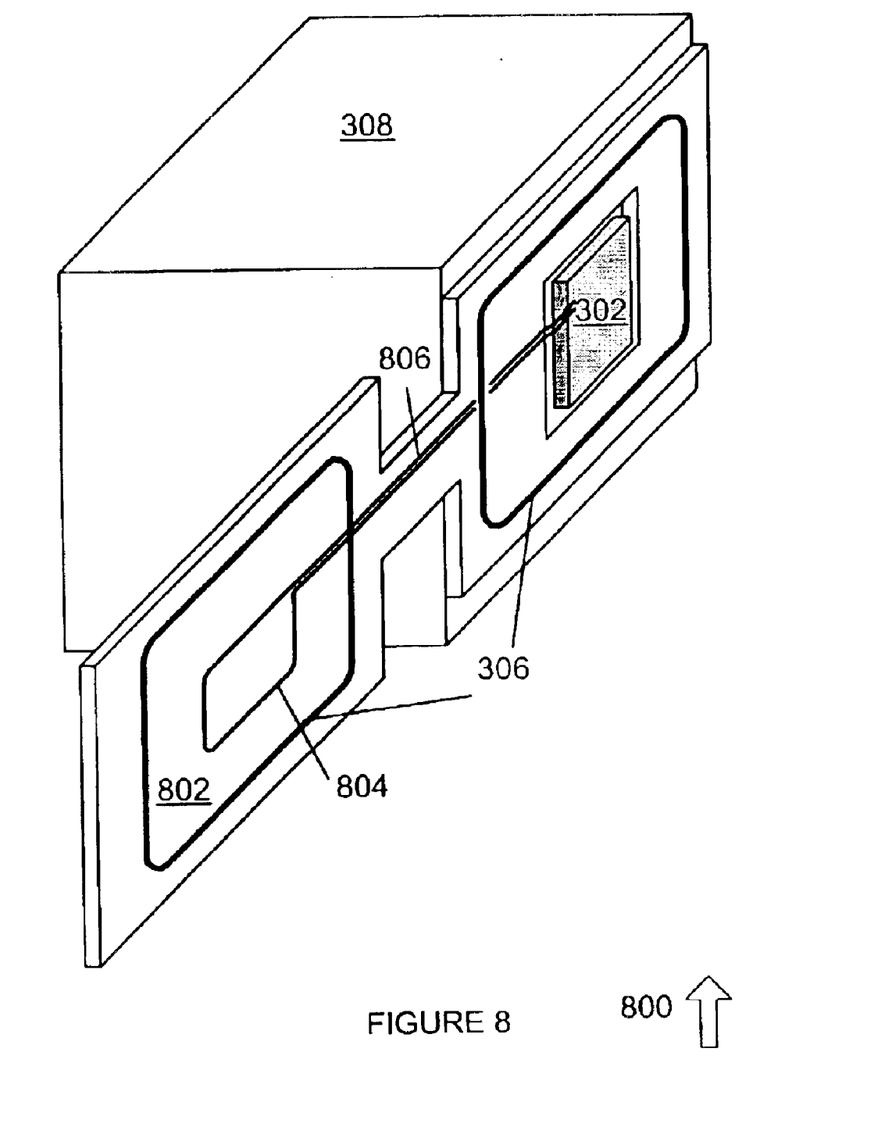
FIG. 8 is a diagram of an active loop amplifier assembly in accordance with an exemplary of the present invention.

FIG. 8 is a diagram of an active loop amplifier assembly 800 in accordance with an exemplary of the present invention. Active loop amplifier assembly 800 includes printed circuit board 802 which supports a pickup loop 804. Pickup loop 804 can include associated parasitic element 304, and provides input to active loop amplifier 302, such as through conductor 806, which can be a microstrip transmission line or other suitable connectors. Thus, pickup loop 804 allows an electromagnetic signal, such as one conducted by a wave guide, to be used to modulate the signal generated by active loop amplifier 302. In one exemplary embodiment, pickup loop 804 can be used to couple to the propagating mode of an input wave guide to generate an input signal, and this input signal can then be transmitted to active loop amplifier 302 via conductors 806.

Figure 9:
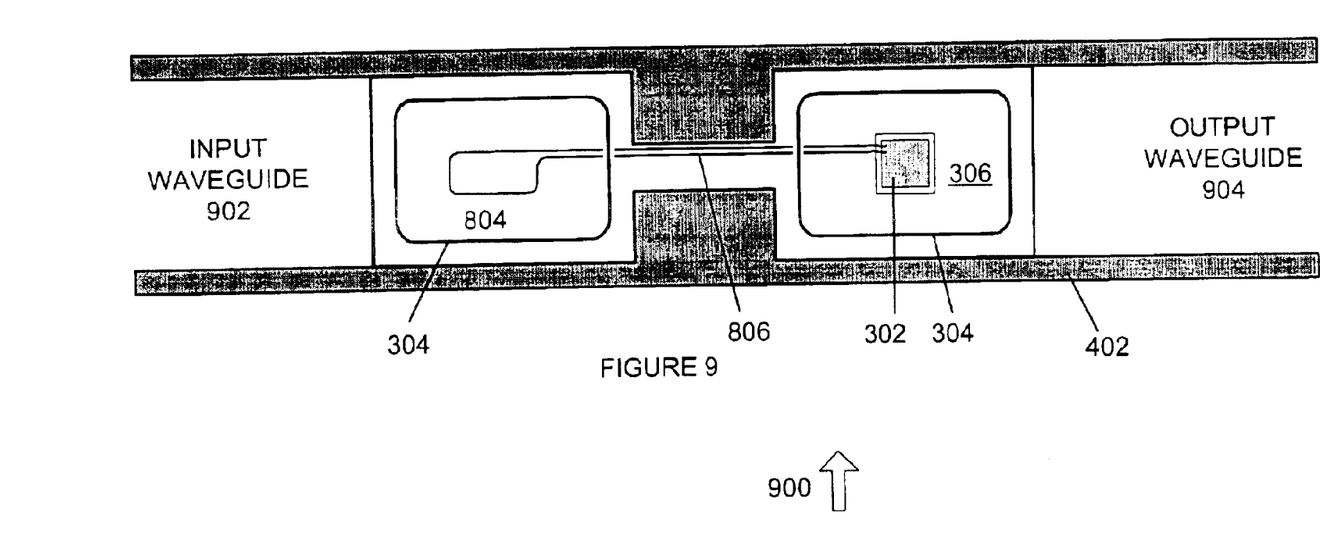
FIG. 9 is a diagram of a wave guide assembly in accordance with an exemplary embodiment of the present invention.

FIG. 9 is a diagram of a wave guide assembly 900 in accordance with an exemplary embodiment of the present invention. Wave guide assembly 900 includes active loop amplifier assembly 800 disposed in wave guide 402. Pickup loop 804 is disposed on printed circuit board 802, input wave guide 902 section of wave guide 402, and ceramic heat spreader 308 supports printed circuit board 802 and active loop amplifier 302 and parasitic element 304 in output wave guide section 904 of wave guide 402. In this manner, pickup loop 804 couples to the propagating mode of input wave guide 902 and drives active loop amplifier 302 using the signal received through input wave guide 902.

Although exemplary embodiments of a system and method of the present invention have been described in detail herein, those skilled in the art will also recognize that various substitutions and modifications can be made to the systems and methods without departing from the scope and spirit of the appended claims.

What is claimed is:

1. A system for amplifying a signal comprising:

a wave guide; and an amplifier enclosed within the wave guide, the amplifier comprising a plurality of linear loop segments, each linear loop segment having an associated transistor pair, wherein the plurality of linear loop segments form a loop that generates a magnetic field in response to the signal, where the magnetic field couples to a propagating mode of the wave guide.

2. The system of claim 1 wherein the amplifier further comprises a plane of orientation, wherein the plane of orientation of the amplifier is parallel to a longitudinal axis of the wave guide.

3. The system of claim 1 wherein the amplifier further comprises:

a first linear loop segment;

a first switch coupled to a first end of the first linear loop segment;

a second switch coupled to a second end of the first linear loop segment;

a second linear loop segment having a first end coupled to the second switch;

a third switch coupled to a second end of the second linear loop segment;

a third linear loop segment having a first end coupled to the third switch;

a fourth switch coupled to a second end of the third linear loop segment;

a fourth linear loop segment having a first end coupled to the fourth switch and a second end coupled to the first switch, wherein current flowing in the first linear loop segment, the second linear loop segment, the third linear loop segment and the fourth linear loop segment generates the magnetic field in response to the signal.

4. The system of claim 1 wherein the amplifier further comprises:

one or more winding loop segments;

a first switch coupled to a first end of each of the winding loop segments;

a second switch coupled to a second end of each of the winding loop segments;

and wherein the first switch and the second switch are operated so as to cause current to flow through the winding loop segments in response to the signal.

5. The system of claim 1 further comprising a heat spreader, wherein the amplifier is disposed on the heat spreader.

6. The system of claim 1 further comprising a parasitic element disposed around the amplifier.

7. The system of claim 1 further comprising:

a second amplifier;

a heat spreader; and wherein the amplifier and the second amplifier are disposed on the heat spreader.

8. The system of claim 1 further comprising a pick-up loop coupled to the amplifier, wherein the pick-up loop generates the signal.

9. A system for amplifying a signal comprising:
a first amplifier generating a first magnetic field;
a second amplifier generating a second magnetic field; and
wherein the first magnetic field and the second magnetic field are spatially combined to form a resultant magnetic field, and wherein each amplifier further comprises;
   a first switch coupled to a first end of a first linear loop segment;
   a second switch coupled to a second end of the first linear loop segment;
   a second linear loop segment having a first end coupled to the second switch;
   a third switch coupled to a second end of the second linear loop segment;
   a third linear loop segment having a first end coupled to the third switch;
   a fourth switch coupled to a second end of the third linear loop segment; and
   a fourth linear loop segment having a first end coupled to the fourth switch and a second end coupled to the first switch, wherein current flowing in the first linear loop segment, the second linear loop segment, the third linear loop segment and the fourth linear loop segment generates the magnetic field of the amplifier in response to the signal.

10. The system of claim 9 wherein the two or more amplifiers are enclosed within a wave guide.

11. The system of claim 9 wherein the two or more amplifiers are disposed on a heat spreader.

12. The system of claim 9 wherein the two or more amplifiers are each disposed on one of two or more heat spreaders.

13. The system of claim 9 wherein the two or more amplifiers further comprise an array of amplifiers.

14. The system of claim 9 wherein the two or more amplifiers further comprise an N×M quasi-optical array of amplifiers, where N and M are integers equal to or greater than 1.

15. The system of claim 13 further comprising an input phasing system generating a first phased input signal for the first amplifier and a second phased input signal for the second amplifier.

16. A method for amplification using spatial power combining comprising:
   modulating an input signal onto a first magnetic field using a first integrated loop-shaped amplifier having four straight conducting segments, each segment coupled to the other segments through one or more active devices, wherein the first integrated loop-shaped amplifier is contained within a wave guide;
   modulating the input signal onto a second magnetic field using a second integrated loop-shaped amplifier having four straight conducting segments, each segment coupled to the other segments through one or more active devices, wherein the second integrated loop-shaped amplifier is contained within the wave guide; and
   spatially combining the first magnetic field and the second magnetic field.

17. The method of claim 16 wherein the active devices drive current through the conducting segments so as to amplify the input signal.

18. The method of claim 16 wherein spatially combining the first magnetic field and the second magnetic field comprises coupling the first magnetic field and the second magnetic field to a propagating mode of a metallic tube wave guide.

19. The method of claim 16 wherein spatially combining the first magnetic field and the second magnetic field comprises configuring the first magnetic field and the second magnetic field into a quasi-optical array.

20. The system of claim 16 further comprising a plurality of integrated loop-shaped amplifiers disposed parallel to each other in an array, each generating a magnetic field, where the magnetic field of each of the plurality of integrated loop-shaped amplifiers are spatially combined.

* * * * *

UNITED STATES PATENT AND TRADEMARK OFFICE
CERTIFICATE OF CORRECTION

PATENT NO. : 6,930,556 B2
DATED : August 16, 2005
INVENTOR(S) : Rutledge et al.

It is certified that error appears in the above-identified patent and that said Letters Patent is hereby corrected as shown below:

Column 1,
Line 5, delete "2002", and insert -- 2002. The U.S. Government has certain rights in this invention pursuant to Grant No. DAAG55-98-0001 awarded by the Army. --.

Signed and Sealed this

First Day of November, 2005

JON W. DUDAS
*Director of the United States Patent and Trademark Office*